(12) United States Patent
Gotoh et al.

(10) Patent No.: US 6,565,687 B2
(45) Date of Patent: May 20, 2003

(54) ULTRASONIC BONDING METHOD

(75) Inventors: Masashi Gotoh, Chuo-ku (JP); Jitsuo Kanazawa, Chuo-ku (JP); Hiroki Hara, Chuo-ku (JP)

(73) Assignee: TDK Corporation, Tokyo (JP)

( * ) Notice: Subject to any disclaimer, the term of this patent is extended or adjusted under 35 U.S.C. 154(b) by 0 days.

(21) Appl. No.: 10/191,057

(22) Filed: Jul. 10, 2002

(65) Prior Publication Data

US 2003/0029543 A1 Feb. 13, 2003

Related U.S. Application Data

(62) Division of application No. 09/544,601, filed on Apr. 6, 2000, now Pat. No. 6,460,591.

(30) Foreign Application Priority Data

Apr. 21, 1999 (JP) ............................................. 11-113213

(51) Int. Cl.⁷ .............................................. B32B 31/00
(52) U.S. Cl. ........................................ 156/64; 156/73.1
(58) Field of Search ........................ 156/64, 73.1, 359, 156/499, 580, 580.1, 580.2, 581, 583.1

(56) References Cited

U.S. PATENT DOCUMENTS

| | | | | |
|---|---|---|---|---|
| 4,818,313 A | * | 4/1989 | Sundberg | 156/64 |
| 5,435,863 A | * | 7/1995 | Frantz | 156/64 |
| 5,846,377 A | * | 12/1998 | Frantz et al. | 156/359 |
| 5,855,706 A | * | 1/1999 | Grewell | 156/64 |
| 6,460,591 B1 | * | 10/2002 | Gotoh et al. | 156/359 |

* cited by examiner

Primary Examiner—James Sells
(74) Attorney, Agent, or Firm—Oblon, Spivak, McClelland, Maier & Neustadt, P.C.

(57) ABSTRACT

When connecting electrodes of a chip device CP are ultrasonic-bonded to circuit electrodes provided for a resin substrate 10 to mount the chip device CP on the resin substrate 10, a heater 5 for heating the resin substrate 10 is provided with which the temperature of the resin substrate 10 is raised to a level with which the ratio of elastic modulus $\epsilon h$ realized when heat is supplied with respect to elastic modulus $\epsilon r$ of the resin substrate 10 at room temperature satisfies $1 > \epsilon h / \epsilon r \geq 0.5$. The heater 5 may be provided for the substrate retaining frame 4.

5 Claims, 9 Drawing Sheets

FIG. 5
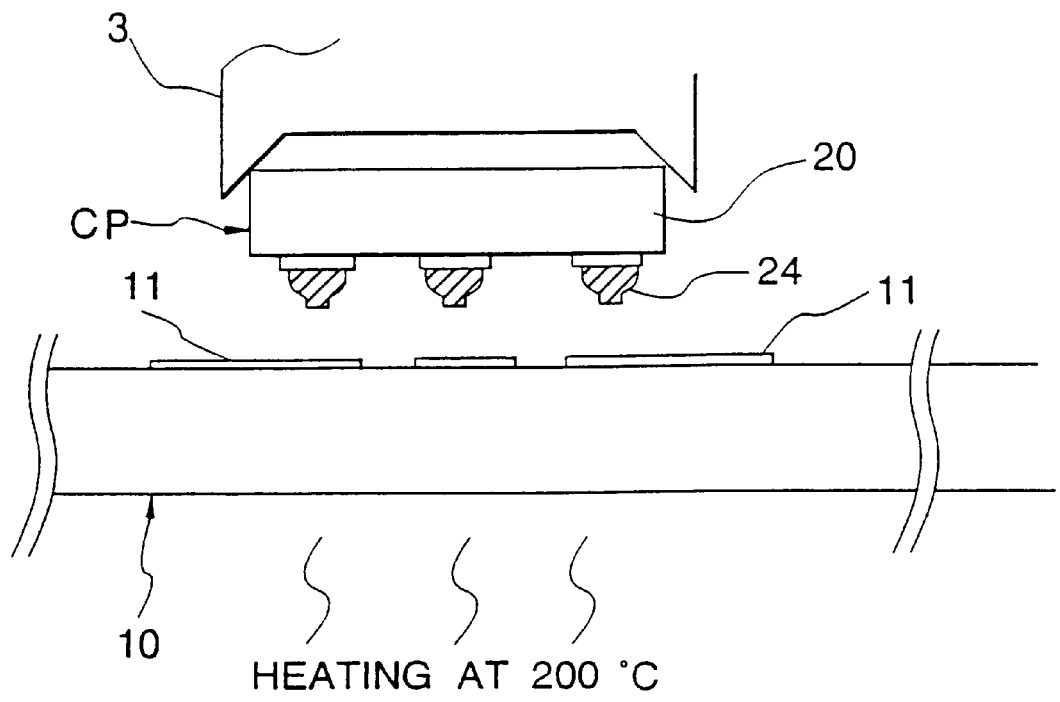
HEATING AT 200 °C
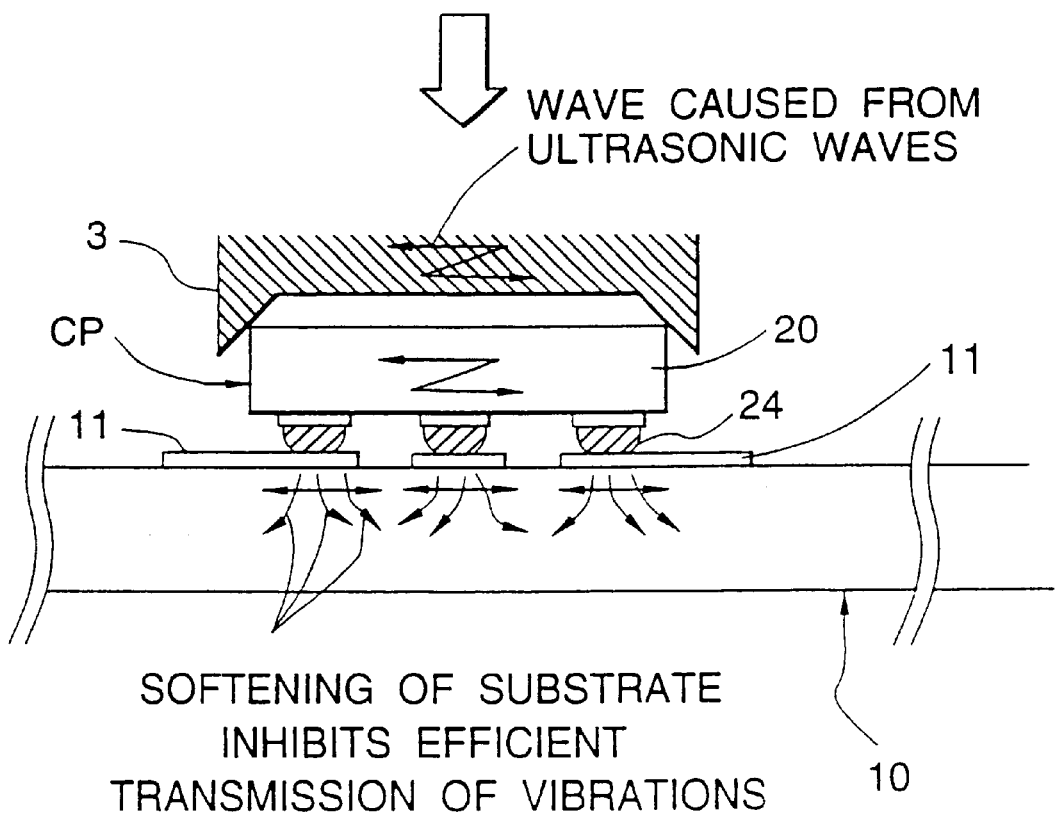
WAVE CAUSED FROM ULTRASONIC WAVES
SOFTENING OF SUBSTRATE INHIBITS EFFICIENT TRANSMISSION OF VIBRATIONS

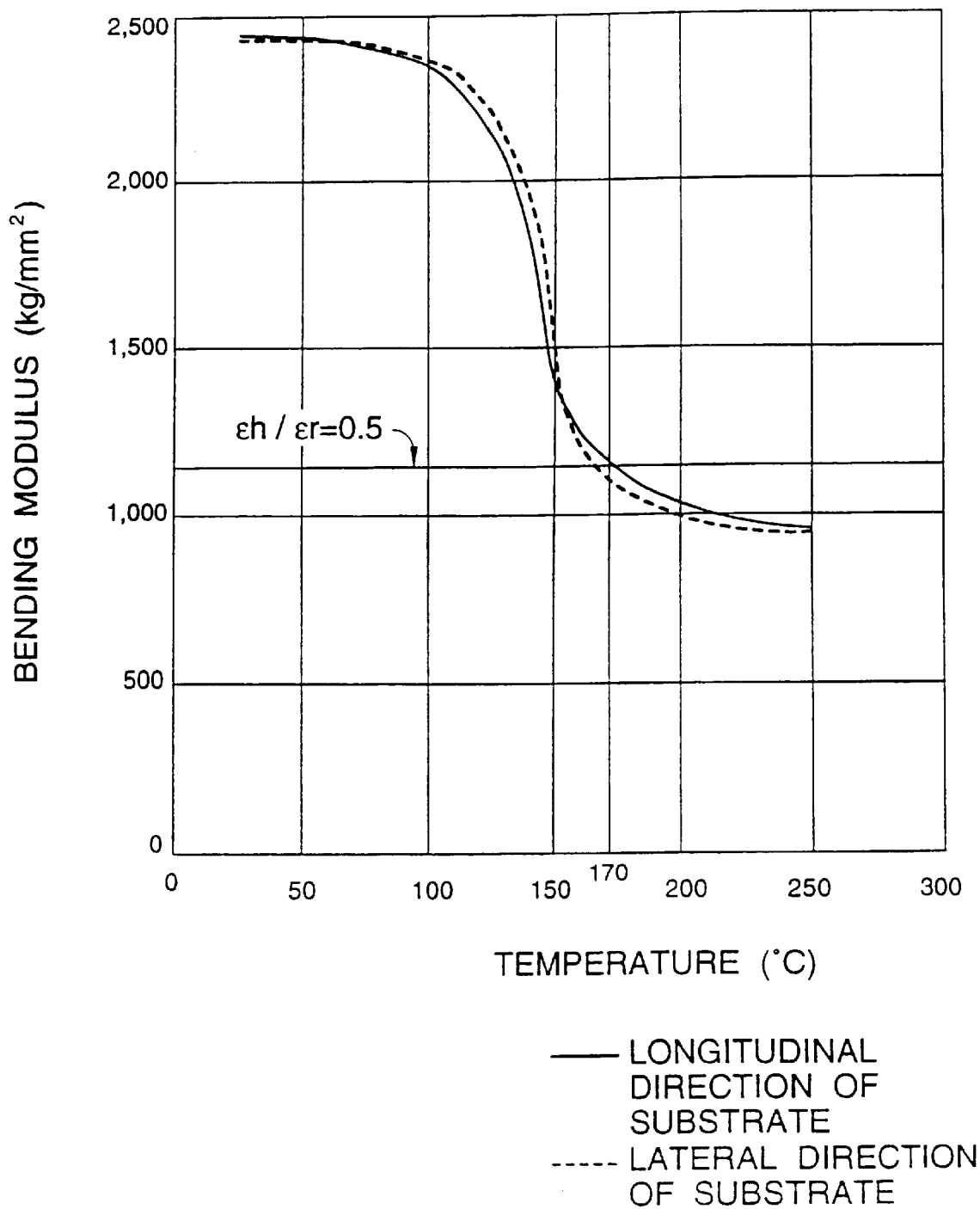

EXAMPLE OF BENDING MODULUS

ULTRASONIC BONDING METHOD

CROSS-REFERENCE TO RELATED APPLICATIONS

This application is a divisional of, and claims priority to U.S. patent Ser. No. 09/544,601, filed Apr. 6, 2000, U.S. Pat. No. 6,460,591 and claims priority to Japanese Application No. 11-113213, filed Apr. 21, 1999. The entire contents of the parent application and the Japanese application are incorporated herein by reference.

BACKGROUND OF THE INVENTION

The present invention relates to an ultrasonic bonding method and an ultrasonic bonding apparatus for mounting a chip device, such as a surface acoustic wave device (SAW) or a semiconductor chip, on a resin substrate or the like by ultrasonic bonding.

The weight, thickness and the size of electronic apparatus have rapidly been reduced. It leads to a fact that a face-down mounting techniques is an important technique with which chip devices, such as surface acoustic wave devices (SAW) or semiconductor chips, can be mounted on a substrate at a high density.

The face-down mounting method is exemplified by an ultrasonic bonding method with which bump electrodes of the chip device are joined to pad electrodes formed on a ceramic substrate by applying ultrasonic waves and a load. The foregoing method is an advantageous method because solder or adhesive agent is not required, thermal stress which is exerted on the chip device can be reduced even if the size of the chip device is reduced and satisfactory bonding strength can be increased. A fact is known that raising of the temperature to 150° C. to 225° C. when the ultrasonic bonding operation is performed raises the bonding strength (refer to, for example, Japanese Patent Laid-Open No. 10-107078).

The ceramic substrate is unsatisfactory in the processability and cost efficiency. Therefore, resin substrates, such as BT resin substrates or heat-resisting glass epoxy substrates, have been employed in recent years to mount the chip devices. When the resin substrate is employed, face-down of the connecting electrode of the chip device to, for example, a bump pattern provided for the resin substrate as the circuit electrode must be performed. Any detailed investigation about the conditions under which the ultrasonic bonding operation suitable for the resin substrate is performed has not been carried out. Therefore, the conventional ultrasonic bonding conditions employed for the conventional ceramic substrate have been employed. That is, adjustment of the temperature which is raised when the ultrasonic bonding operation is performed has not been performed. Hitherto, adjustment of the output of ultrasonic waves and pressure which must be applied has been performed. Therefore, the ultrasonic bonding operation has been performed at a temperature considered to be suitable without any consideration of the characteristic of the resin.

Recently a multiplicity of bump electrodes serving as connecting electrodes are provided for the joining surface of the chip device. When the bump electrodes are provided by disposing, for example, a multiplicity of balls, the heights of the bump electrodes cannot easily be uniformed. It is difficult to simultaneously join a multiplicity of bump electrode having various heights on the substrate having a rough surface. To overcome the dispersion in the nonuniform heights, an anisotropic conductive and adhesive layer has been employed. That is, adhesive layer is applied to the leading ends of the bump electrodes or a solder paste which is fused with heat is used or conductive powder is mixed with the resin to forcibly introduce the bump to establish the connection.

As a result, the attempt to increase the bonding strength results in excessive enlargement of the output of ultrasonic waves and the applied load during the joining operation. Thus, there arises problems in that the pad portion of the chip device is cracked, the pad of the chip device is separated from the chip device and the multiplicity of the bump electrodes provided for the chip device cannot uniformly be joined owing to an adverse influence of the rough surface of the resin substrate.

Moreover, the following problems must be solved.

(1) When the pattern on the circuit substrate on which the chip devices are mounted is fined (for example, a fine pattern of 10 $\mu$m) or when the size of the chip device is reduced (for example, 1 mm×1 mm), stability of the bonding operation must be improved in a case where a micro bump electrode (for example, diameter of 50 $\mu$m) or a micro pad (for example, 100 $\mu$m×100 $\mu$m) is employed.

(2) Residual stress in the bump electrode, the pad, the circuit substrate or the base of the chip device caused from the ultrasonic bonding operation must be minimized.

(3) When a pyro-electric material, such as the SAW or the light modulating device, or dielectric material, such as birefringent optical material, is employed, mechanical shock (distortion and impact) and thermal shock (difference in the temperature and rate at which the temperature is changed) caused from the ultrasonic bonding operation must be reduced. Thus, stress which is exerted on the joint portion must be reduced to prevent, for example, discharge breakdown.

SUMMARY OF THE INVENTION

In view of the foregoing, an object of the present invention is to provide an ultrasonic bonding method with which optimum ultrasonic bonding conditions for a resin substrate can be determined when a chip device is mounted by a face-down method using a resin substrate as the substrate on which the chip device is mounted. The object of the present invention includes realization of ultrasonic bonding which permits a wide margin in the bonding operation, which is capable of realizing stable joining and which exhibits satisfactory reliability for a long time.

Another object of the present invention is to provide an ultrasonic bonding apparatus which is capable of face-down bonding a chip device on a resin substrate, which exhibits a wide margin in the bonding operation, with which stable joining can be realized and which exhibits satisfactory reliability for a long time.

According to first aspect of the invention, there is provided an ultrasonic bonding method arranged to mount a chip device on a resin substrate by performing ultrasonic bonding such that the position of a connecting electrode of the chip device is aligned to the position of a circuit electrode provided for a resin substrate having elastic modulus $\epsilon r$ at room temperature and elastic modulus $\epsilon h$ realized when the resin substrate is heated, the ultrasonic bonding method comprising: a step of heating the resin substrate to a temperature at which the ratio of the elastic modulus $\epsilon r$ at room temperature and the elastic modulus $\epsilon h$ realized after heating satisfies 1>$\epsilon h/\epsilon r$≧0.5 when the circuit electrode and the connecting electrode are ultrasonic-bonded to each other.

The elastic modulus of the resin substrate having satisfactory rigidity at room temperature is reduced owing to applied heat, causing the resin substrate to be flexible. Moreover, the reduction in the elastic modulus is limited to the half value of the elastic modulus realized at the room temperature. Therefore, when the bonding operation is performed such that the position alignment between the circuit electrode and the connecting electrode is performed and ultrasonic waves or a load is exerted, excessive deformation of the resin substrate can be prevented. Thus, energy of the ultrasonic waves, the load and heat are exerted in between the circuit electrode and the connecting electrode. Moreover, the resin substrate is adequately deformed to moderate the mechanical shock caused from the bonding operation. In particular, when a multiplicity of circuit electrodes and connecting electrodes are simultaneously ultrasonic-bonded, the flexibility of the resin substrate causes the joined portion to be deformed. Thus, uniform bonding of a multiplicity of the points can be performed even if the joined portion has a rough surface.

Preferably, temperature raised when the resin substrate is ultrasonic-bonded satisfies a range from 80° C. to 170° C.

Preferably, an amount of amplitude of ultrasonic waves arranged to be imparted on the chip device when the ultrasonic bonding operation is performed satisfies a range from 0.8 µm to 1.6 µm.

Preferably, the chip device is a surface acoustic wave device having a dielectric substrate, and the connecting electrode is a bump electrode formed on the dielectric substrate and made of gold or a gold alloy.

Preferably, the resin substrate is a thermosetting resin substrate, and the circuit electrode is constituted by forming a plated layer on the surface of a copper foil pattern, and the uppermost layer of the plated layer is made of gold.

Further, according to second aspect of the invention, there is provided an ultrasonic bonding apparatus arranged to ultrasonic-bond a connecting electrode of a chip device to a circuit electrode provided for a resin substrate to mount the chip device on the resin substrate, the ultrasonic bonding apparatus comprising: resin-substrate heating means for heating the resin substrate to a temperature at which the ratio of elastic modulus ϵr of the resin substrate at room temperature and elastic modulus ϵh realized after heating satisfies 1>ϵh/ϵr≧0.5.

BRIEF DESCRIPTION OF THE PREFERRED EMBODIMENTS

FIG. 5 is a diagram showing a state in which ultrasonic waves are transmitted owing to inadequate supply of heat to a resin substrate;

FIG. 7 is a graph showing the relationship between the bending modulus of a BT resin substrate serving as the circuit substrate and the temperature;

DETAILED DESCRIPTION OF THE PREFERRED EMBODIMENTS

Embodiments of an ultrasonic bonding method and an ultrasonic bonding apparatus according to the present invention will now be described with reference to the drawings.

Figure 1:
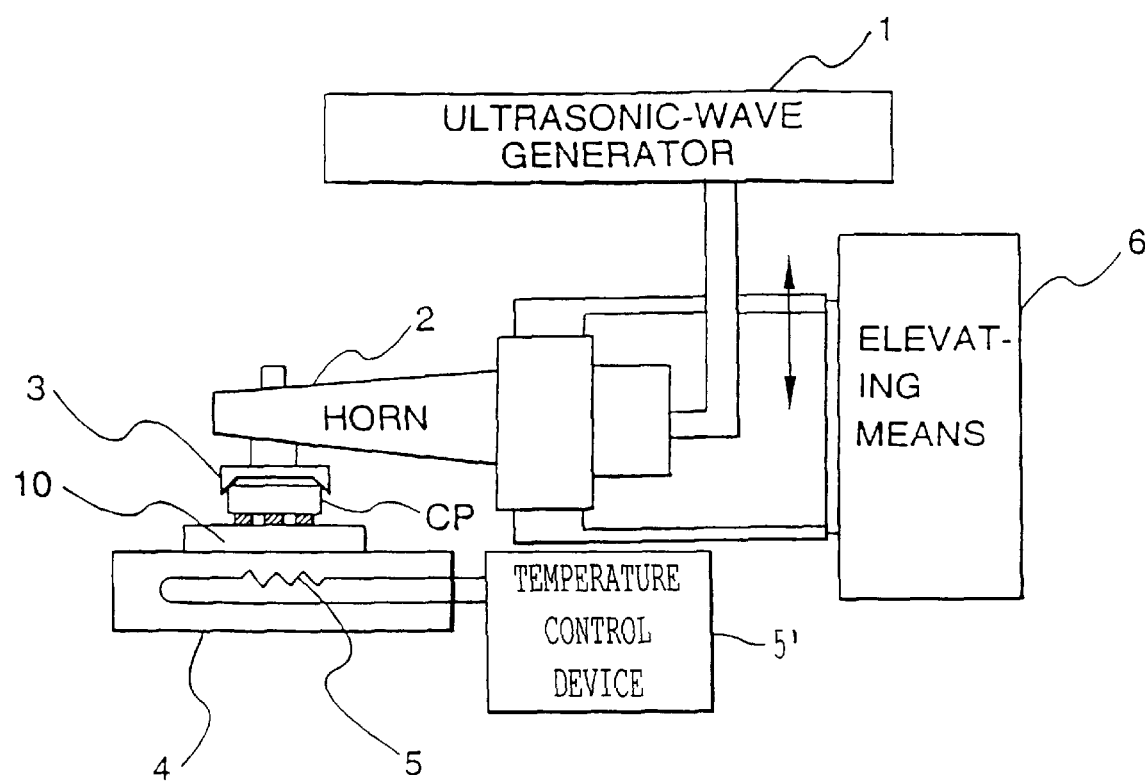
FIG. 1 is a schematic view showing the structure of an ultrasonic bonding apparatus according to an embodiment of the present invention.

FIG. 1 shows the schematic structure of the ultrasonic bonding apparatus for use in the embodiment of the present invention. A collet 3 is joined to an ultrasonic-wave horn 2 which is operated by an ultrasonic-wave generator 1. The collet 3 uses negative pressure generated owing to vacuum sucking to suck and hold a chip device CP which must be mounted. To place and fix a resin substrate 10 which is a circuit substrate, a substrate retaining frame 4 is disposed. The substrate retaining frame 4 is provided with a heater 5 serving as a means for heating the substrate. The heater 5 is able to raise the temperature of the resin substrate 10 to a level (for example, a range from 80° C. to 170° C.) at which a ratio of elastic modulus ϵr at room temperature (25° C.) and elastic modulus ϵh realized after heating satisfies 1>ϵh/ϵr≧0.5. Note that an elevating means 6 is provided for vertically moving the ultrasonic-wave horn 2 and the collet 3 with respect to the substrate retaining frame 4.

Figure 2:
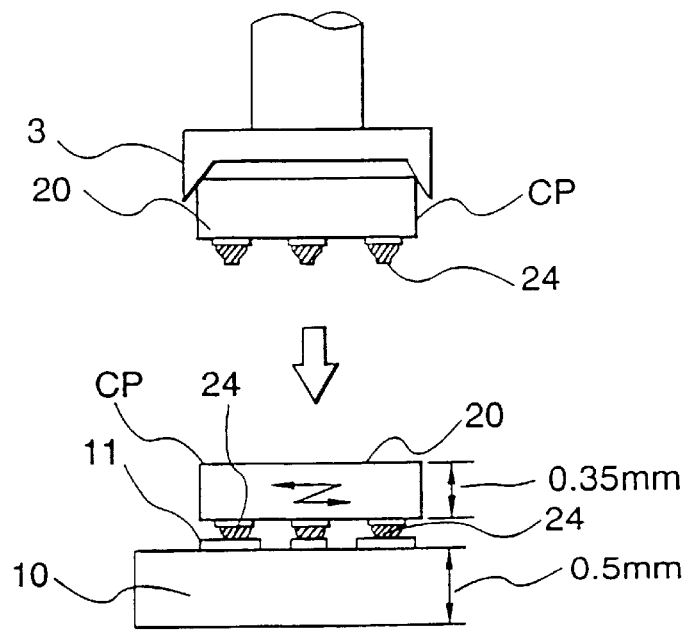
FIG. 2 is a diagram showing an ultrasonic bonding method according to an embodiment of the present invention.
Figure 3:
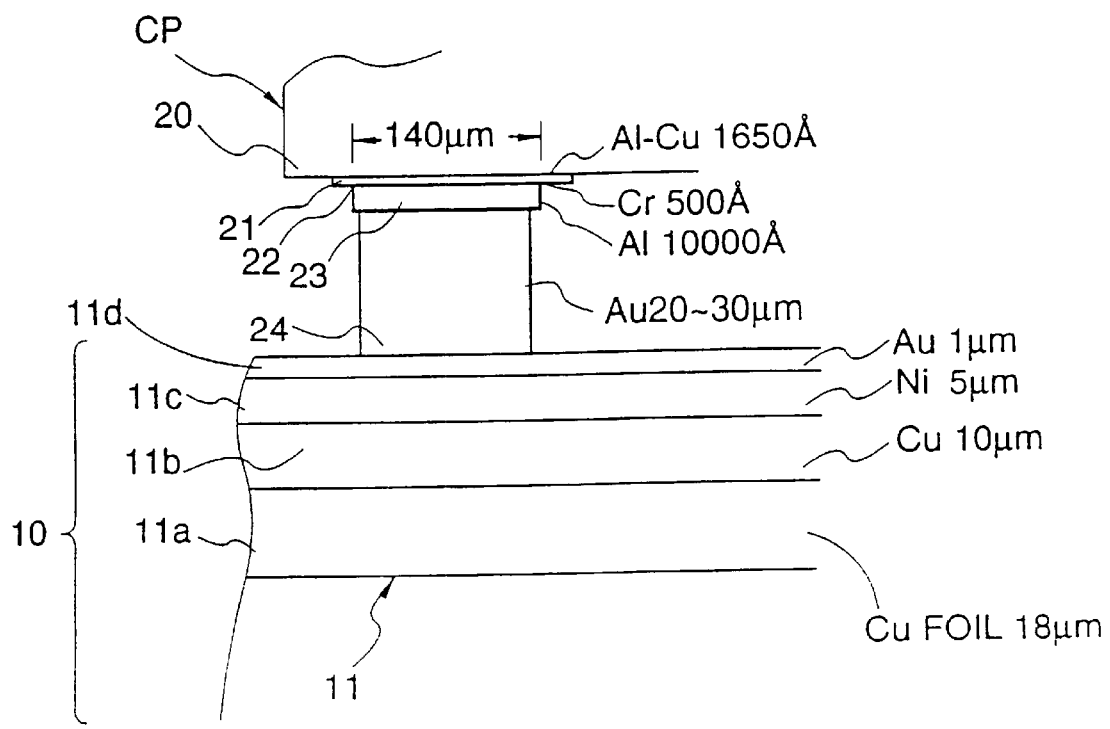
FIG. 3 is an enlarged cross sectional view showing bump electrodes of the chip device and the circuit electrodes of the substrate according to the embodiment.

When the chip device CP which is shown in FIGS. 2 and 3 and which must be mounted is SAW, a substrate 20 (having a thickness of, for example, 0.35 mm) is made of piezoelectric material, such as $LiNbO_3$, $LiTaO_3$ or quartz. A circuit pattern 21, the main component of which is Al (for example, Cu is contained by 0.5 wt %), is formed on the substrate 20 as shown in FIG. 3 in an enlarged manner. A relatively thick (for example, 1000 Å) Al layer 23 is formed on the circuit pattern 21 such that an intermediate layer 22 made of Cr is interposed. Bump electrodes 24 are formed on the uppermost layer by a joining method with which a wire having a diameter of about 25 µm and mainly composed of Au is used to apply both heat and ultrasonic waves to the pad portion of the wafer which is the base of the piezoelectric material. The wafer having the Au bump electrodes is then diced so as to be divided into each device.

As the resin substrate 10, a BT resin substrate (CCL-HL-830 manufactured by Mitsubishi Gas Chemical) having a thickness of 0.5 mm is employed. As the circuit pattern and the circuit electrode 11 of the substrate, a Cu-plated layer 11b having a thickness of 10 µm, a Ni-plated layer 11c having a thickness of 5 mm and an uppermost Au-plated layer 11d having a thickness of 0.5 µm to 1 µm are laminated on Cu foil 11a having a thickness of 18 mm.

The foregoing chip device CP is sucked and held by the collet 3, as shown in FIG. 2. The position alignment of the Au bump electrodes 24 serving as the connecting electrodes of the chip device CP is performed. Then, the Au bump electrodes 24 are pressed against the circuit substrate 11 provided for the resin substrate 10. Thus, the ultrasonic bonding operation, that is, the ultrasonic thermo-compression bonding method is performed to perform joining.

At this time, the ultrasonic thermo-compression binding method has been disclosed in, for example, Unexamined Japanese Patent Publication 10-107078 in which the ceramic substrate is heated to 150° C. to 225° C. or the ceramic substrate is ultrasonic thermo-compression bonded at 200° C. ("Flip Chip Bonding Technology Using Thermosonic Bonding" Microjoining and Assembly Technology in Electronics, 1997).

On the other hand, the present invention is established such that attention is focused on the elastic modulus of the resin substrate 10. Thus, the ultrasonic bonding operation is performed under conditions, such as the temperature of the substrate, distinct from the conventional ceramic substrate. The reason for this will now be described.

Figure 4:
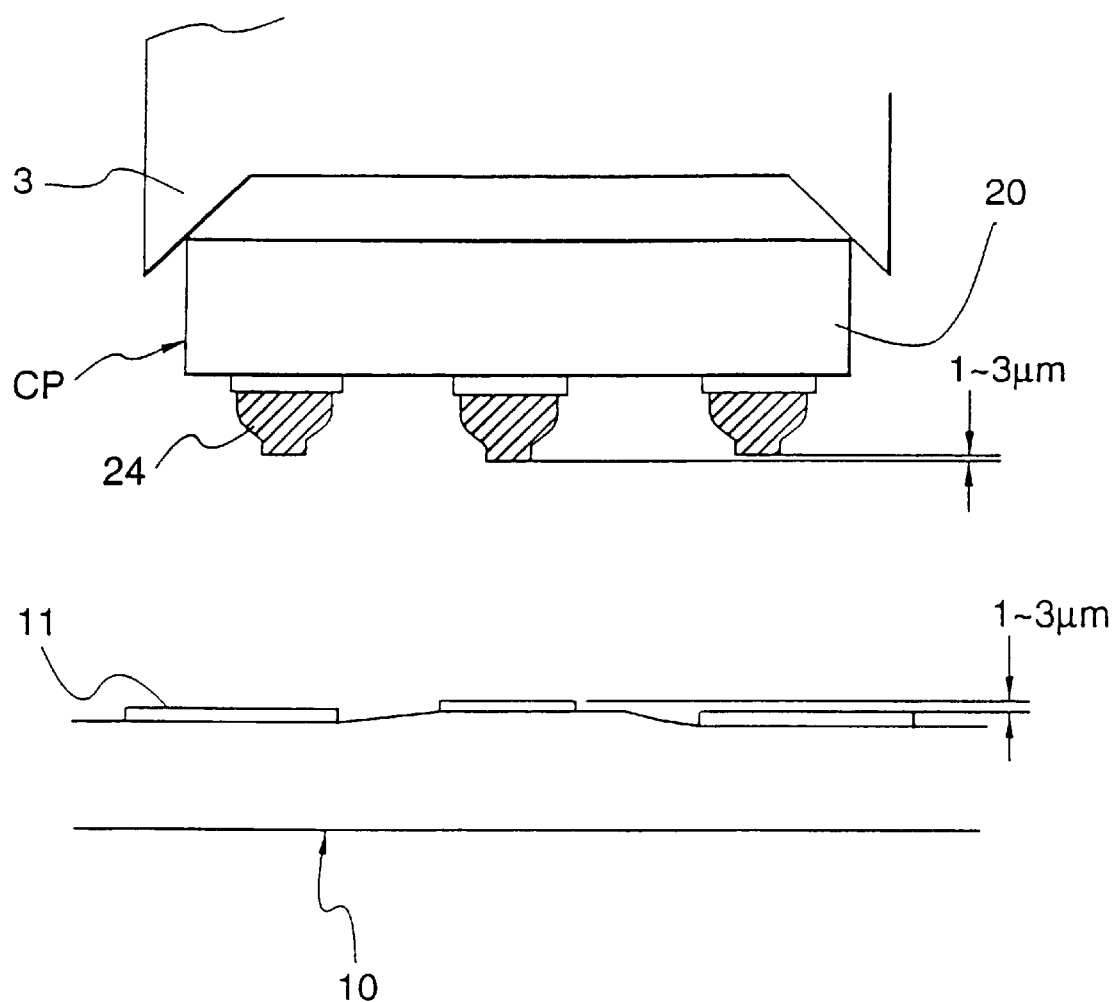
FIG. 4 is a diagram showing a state in which the heights of the bump electrodes of the chip device and the circuit electrodes of the substrate are dispersed.

The height of the Au bump electrodes formed on the chip device is dispersed by about ±10 μm when a pull-cutting method is employed. If the heights of the bumps are uniformed, dispersion of about 1 μm to about 3 μm cannot be overcome. Also the roughness of the surface of the resin substrate has dispersion of about 1 μm to about 3 μm. Therefore, the gap between the bump electrodes of the device and the pads of the circuit electrode is dispersed by a total amount of about 2 μm to 6 μm, as shown in FIG. 4. When all of the bump electrodes of the chip device CP having the plurality of the Au bump electrodes 24 are joined to the circuit substrate 11 with uniform strength, the bonding conditions for the ultrasonic bonding operation must be determined in such a manner that a wide margin is permitted and stable joining can be performed.

Figure 6:
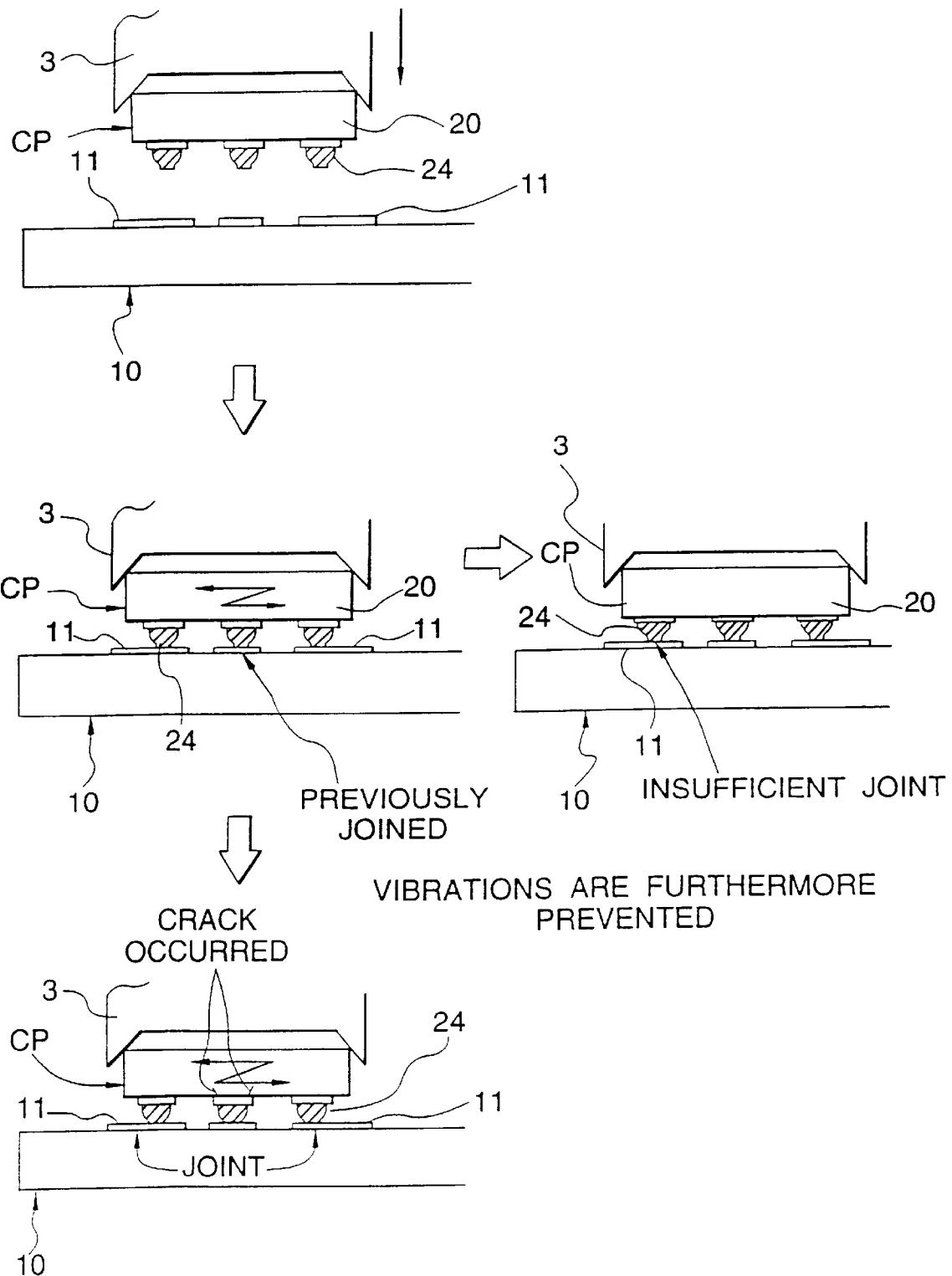
FIG. 6 shows a model of defective joining caused from shift of joining timing of the bump electrodes.

When a plurality of Au bump electrodes are simultaneously joined by the ultrasonic thermo-compression bonding method, it has been considered that removal of an oxide film in the joined portion is required and mutual dispersion of Au must quickly be performed. To minimize damage of the chip device, heat of about 200° C. must be exerted. When the resin substrate is employed, heat of 200° C. causes the rigidity of the substrate to deteriorate owing to heat. As a result, ultrasonic vibrations are undesirably diffused through the resin substrate 10, as shown in FIG. 5. Therefore, ultrasonic waves cannot efficiently be transmitted. Hence it follows that required strength cannot be obtained or timing at which each of the plural bump electrodes 24 provided for the chip device CP are joined to the circuit substrate 11 of the resin substrate 10 scatters. In the foregoing case, the pad of the chip device CP joined previously encounters separation and a crack, as shown in FIG. 6. What is worse, joining sometimes become unsatisfactory. When the load, power or duration of exertion of ultrasonic waves is enlarged to prevent the foregoing problems, the chip device CP sustains greater damage.

FIG. 7 shows the relationship between the elastic modulus and the temperature of the BT resin substrate (CCL-HL-830 manufactured by Mitsubishi Gas Chemical Co.) which is the resin substrate. As can be understood from the graph, the bending modulus deteriorates to ½ or lower as compared with the bending modulus realized at room temperature (25° C.) at about 150° C. which is the point of inflection. When the conventional ceramic substrate is heated to 200° C. or higher, the bending modulus considerably deteriorates by 40% or greater.

When the resin substrate having satisfactory rigidity at room temperature is heated, the elastic modulus is deteriorates and flexibility is imparted. Under conditions that the deterioration in the elastic modulus is prevented to the half value of the elastic modulus which is realized at room temperature, the excessive deformation of the resin substrate can be prevented when a bonding operation is performed such that alignment of the positions of the circuit electrode and the connecting electrode is performed and exertion of ultrasonic waves and a load is performed. Thus, energy of the ultrasonic waves, the load and heat are exerted in between the circuit electrode and the connecting electrode. Moreover, the resin substrate adequately deforms to moderate the mechanical shock caused from the bonding operation. When a multiplicity of circuit electrodes and connecting electrodes are simultaneously ultrasonic-bonded, flexibility of the resin substrate 10 causes the joined portion to be deformed even if the joined portion has rough surface (if the distance between the bump electrode 24 of the device and the circuit substrate 11 of the substrate disperses) as described with reference to FIG. 4. Thus, uniform bonding of a multiplicity of points can be performed.

Figure 8A:
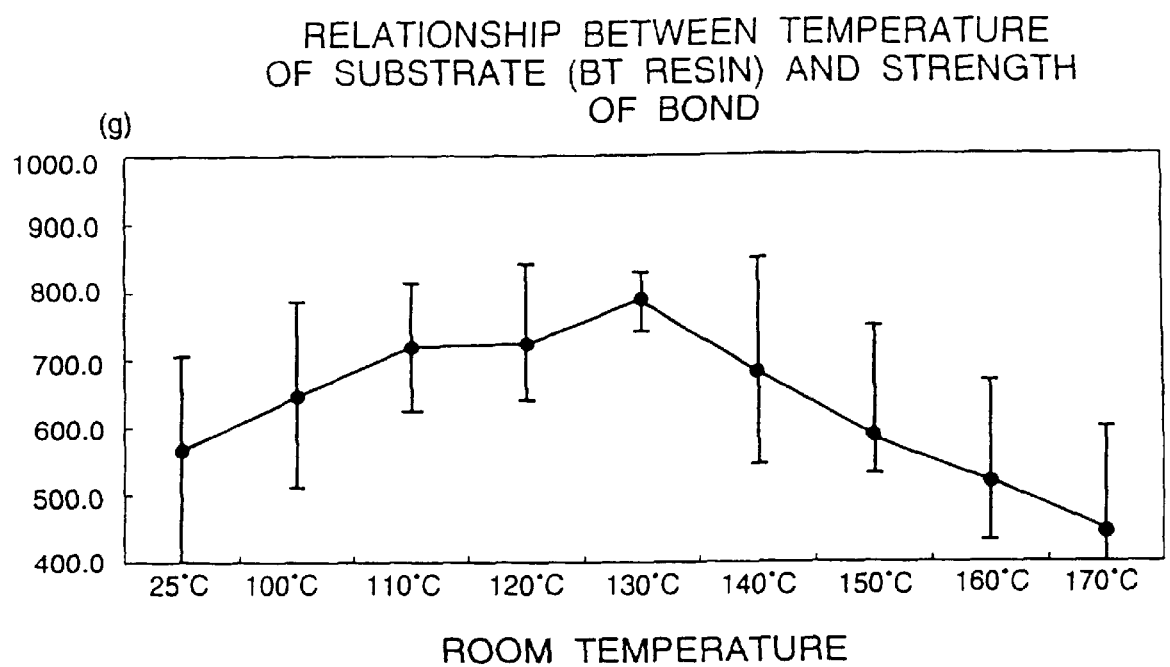
FIG. 8 is a graph showing the relationship between bonding temperature and bonding strength of the device realized by the ultrasonic thermo compression bonding as the ultrasonic bonding and a breakdown mode.
Figure 8B:
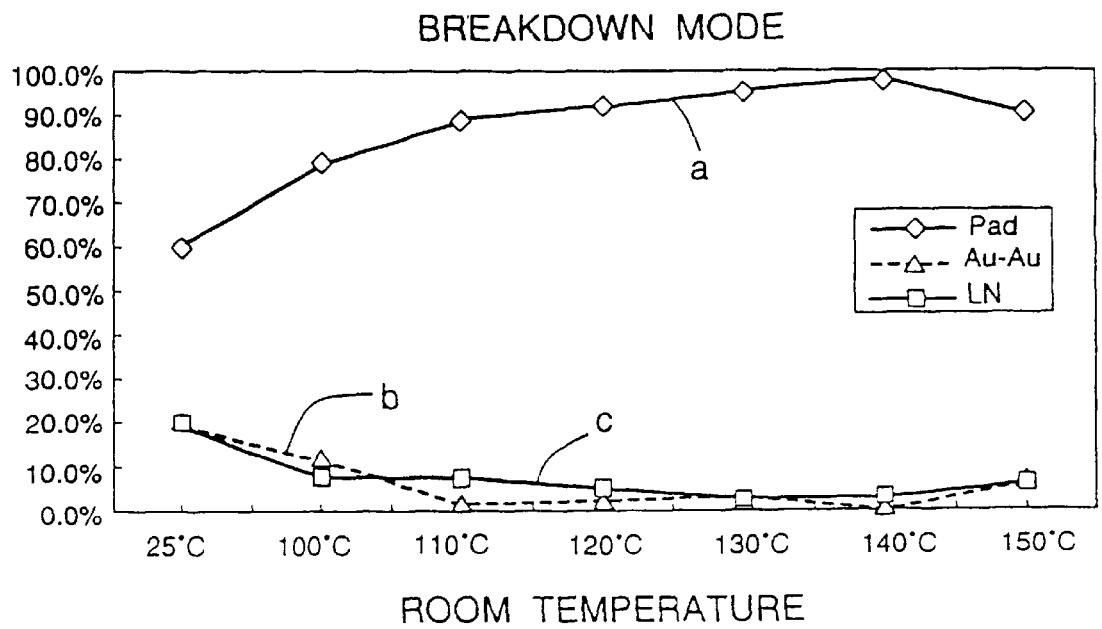

FIG. 8 is a graph showing the relationship between the temperature of the substrate and the bonding strength of the chip device having the electrode structured as shown in FIG. 3. FIG. 8A shows the relationship between the temperature of the substrate and the bonding strength (shearing resistance) of the chip device on the substrate. FIG. 8B shows a breakdown mode (curve a indicates a ratio of breakdown of the Al pad layer of the chip device, curve b indicates a ratio of breakdown between the Au bump electrode of the device and Au-plated layer of the substrate and curve c indicates a ratio of the breakdown of the device). As can be understood from FIG. 8A, the shearing resistance of the bonded portion is made to be maximum when the temperature of the substrate is 130° C. The ratio of the bending modulus at 130° C. with respect to the bending modulus at room temperature shown in FIG. 7 (the bending modulus at 130° C./bending modulus at room temperature) was 0.875. As can be understood from the breakdown mode shown in FIG. 8B, separation between the Au-bump electrode and the Au-plated layer occurs frequently in a low temperature range lower than 80° C. Moreover, breakdown of the devices occurs frequently. When the temperature of the substrate is raised, strength can be increased because the material breakdown of the device pad portion has occurred (it means a fact that joining between the Au-bump electrodes and the Au pads of the substrate is strong). When the temperature is higher than 170° C. at which (the bending modulus when heat is applied/the bending modulus at room temperature) is lower than 0.5, separation occurs between the Au bump electrode and the Au pads of the substrate. Also the strength rapidly deteriorates. When the temperature conditions for the bonding operation are made such that the temperature of the substrate is raised, the device sustains damage and defect joint easily occurs.

Therefore, according to this embodiment, there is provided an ultrasonic bonding method arranged to mount a chip device on a resin substrate by performing ultrasonic bonding such that the position of a connecting electrode of the chip device is aligned to the position of a circuit electrode provided for a resin substrate having elastic modulus $\epsilon r$ at room temperature and elastic modulus $\epsilon h$ realized when the resin substrate is heated, the ultrasonic bonding method comprising: a step of heating the resin substrate to a temperature at which the ratio of the elastic modulus $\epsilon r$ at room temperature and the elastic modulus $\epsilon h$ realized after heating satisfies $1 > \epsilon h/\epsilon r \geq 0.5$ when the circuit electrode and the connecting electrode are ultrasonic-bonded to each other. Specifically, it is preferable that the temperature satisfies a range from 80° C. to 170° C., more preferably a range from 80° C. to 140° C. and most preferably a range from 100° C. to 130° C.

Figure 9:
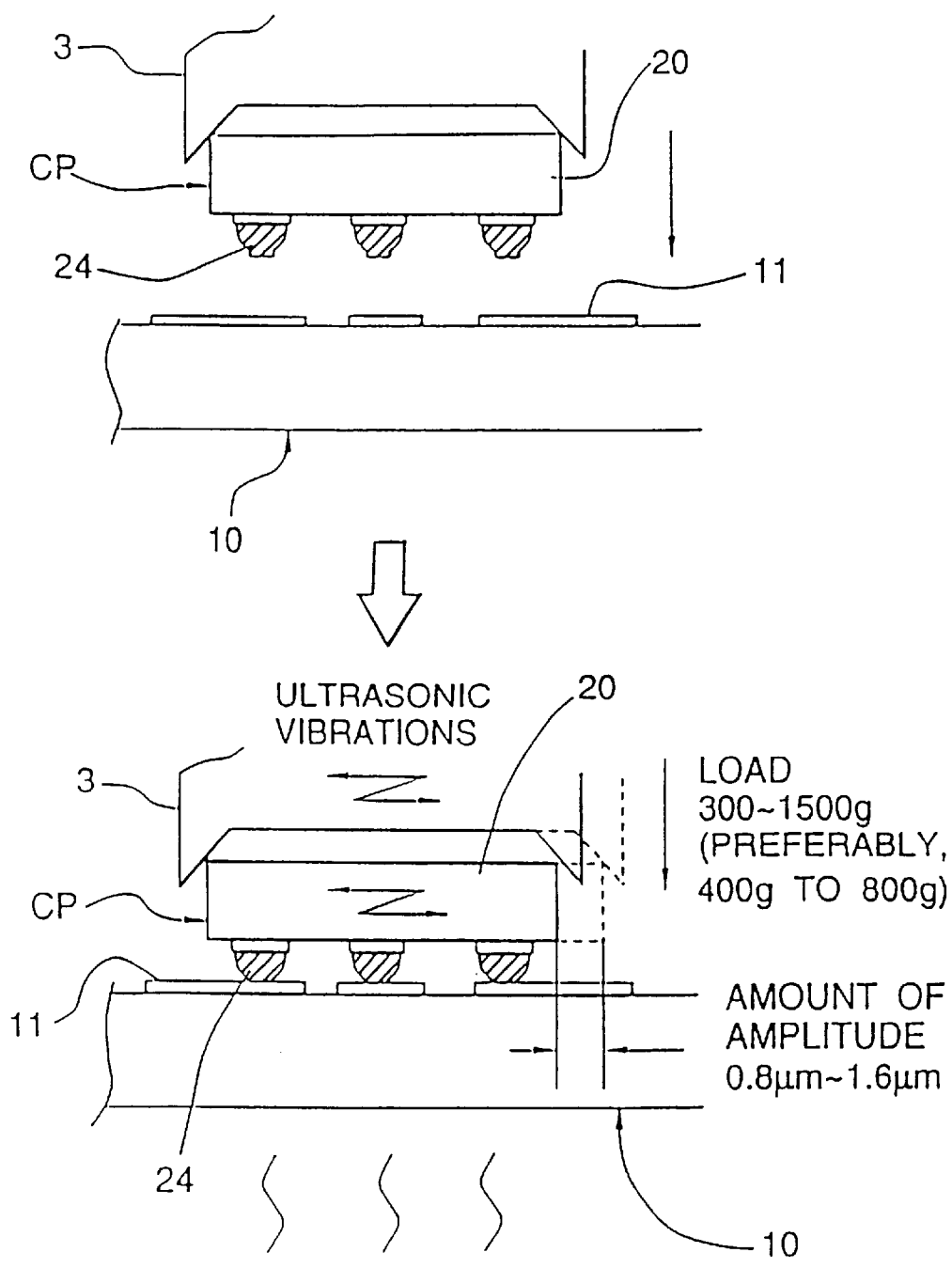
FIG. 9 is a diagram showing ultrasonic bonding conditions.

FIG. 9 shows a state in which the ultrasonic bonding according to this embodiment is performed and conditions employed in this process. The conditions under which the flip chip is mounted except for the temperature of the substrate are such that the amount of amplitude of ultrasonic waves is 0.8 mm to 1.6 mm, the load is 300 g to 1500 g (preferably, 400 g to 800 g) and duration for which ultrasonic waves are applied is 0.03 second to 0.5 second. When the foregoing conditions are satisfied, breakdown of the chip device occurring during the ultrasonic bonding process can be prevented. Moreover, joining between the circuit electrode of the substrate and the connecting electrode of the device can reliably be performed.

According to this embodiment, the following effects can be obtained.

The resin substrate 10 is heated by the substrate heating means to a temperature at which the ratio of the elastic modulus $\epsilon h$ realized when heat is supplied with respect to the elastic modulus $\epsilon r$ at room temperature satisfies $1 > \epsilon h/\epsilon r \geq 0.5$. Then, the circuit electrode 11 of the substrate and the Au bump electrodes 24 serving as the connecting electrodes of the device are joined by ultrasonic bonding. Therefore, ultrasonic bonding can be performed in a range in which the resin substrate 10 has adequate rigidity. Thus, dispersion of the heights of the bump electrodes and the circuit electrodes can be absorbed. Moreover, the electrodes can stably and reliably be joined to each other by ultrasonic waves.

The temperature to which the resin substrate 10 is heated during the ultrasonic bonding process is a relatively low level of about 80° C. to about 170° C. The temperature of the substrate is lower than the temperature of about 200° C. to which the ceramic substrate is heated by the conventional method. When the pyro-electric substrate, such as the SAW, is employed as the chip device, there is apprehension that the device pattern is discharge-broken owing to thermal shock caused from bonding which is performed at high-temperature (for example, 200° C. or higher). Since joining can be performed at the low temperature by using the resin substrate, the thermal shock can be moderated and discharge-breakdown can be prevented.

The amount of the amplitude of ultrasonic waves which is exerted on the chip device during the ultrasonic bonding process satisfies a range from 0.8 $\mu$m to 1.6 $\mu$m. Moreover, the load satisfies a range from 300 g to 1500 g. Therefore, the residual stress in the circuit substrate and the base of the chip device can be minimized so that stability of the ultrasonic bonding is improved.

When the embodiment is arranged to anneal the substrate to improve the heat resistance of the resin substrate, joining can be performed at a higher temperature.

The ceramic substrate and the glass substrate are free of deterioration of the bending modulus at a temperature of about 200° C. as compared with the bending modulus realized at room temperature. Therefore, the ratio of the bending modulus during the bonding process with respect to the bending modulus at room temperature is about one. Therefore, the effect obtainable from the resin substrate that the dispersion of the heights of the bump electrode and the circuit electrodes is absorbed by adequately setting the rigidity by performing heating cannot be obtained.

The resin substrate serving as the circuit substrate, which is the BT resin substrate in this embodiment, may be a thermo-setting substrate, a resin substrate having reinforcing filler, such as glass fiber, or a resin-molded substrate. Also the type of the resin is not limited to the thermosetting material. A thermoplastic material may be employed.

Figure 10:
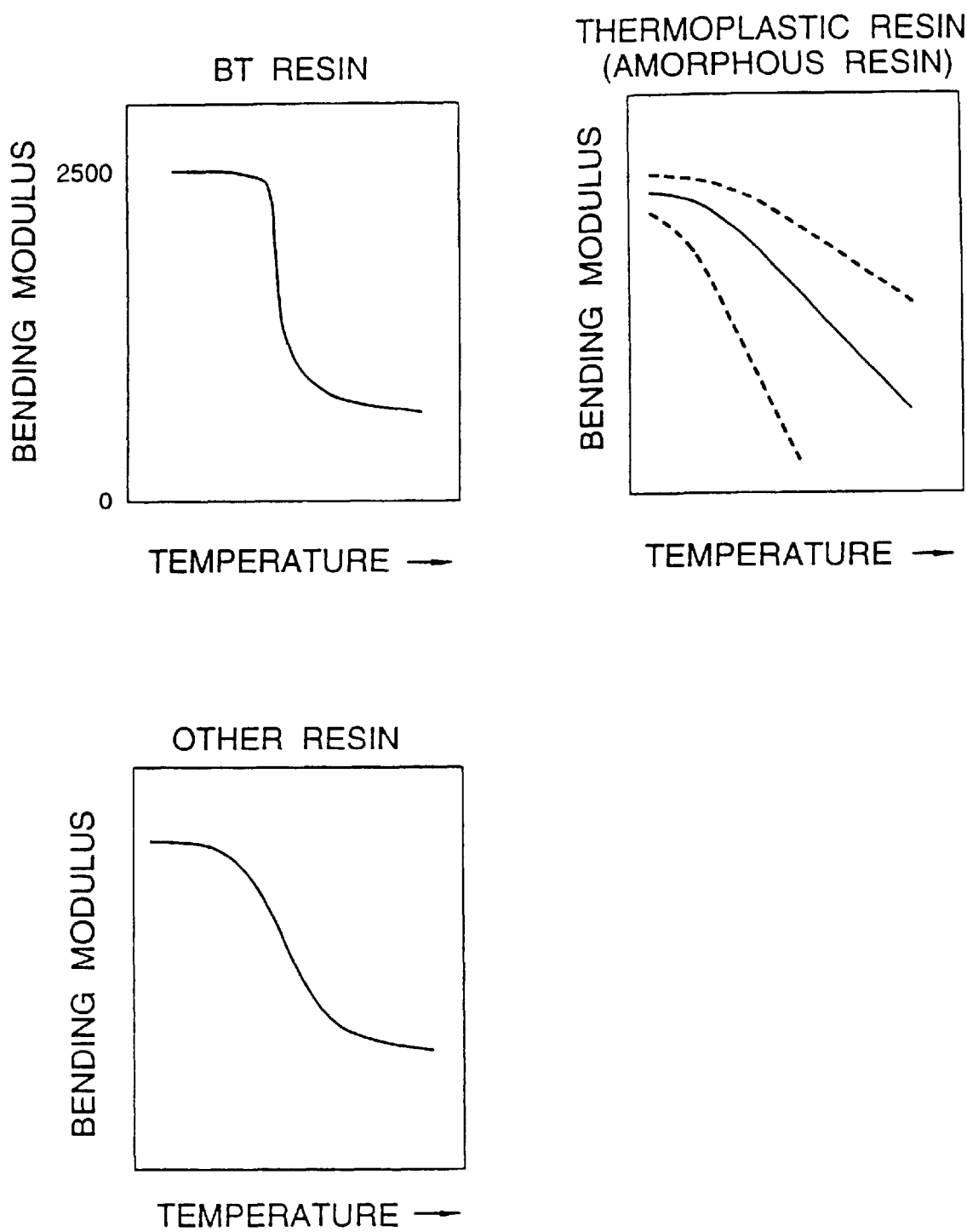
FIG. 10 is a graph showing the relationship between the bending modulus and the temperature of the other resin.

The elastic modulus is not required to have the inflection point as distinct from the BT resin shown in FIG. 7. For example, resin, such as amorphous plastic, having a characteristic with which the bending modulus is monotonously and gently deteriorates as the temperature is raised as shown in the characteristic graphs shown in FIG. 10 except for that of the BT resin may be employed.

Although the foregoing embodiment has the structure that the resin substrate is employed as the resin base, the present invention may be applied to a structure in which a resin flat portion partially is formed.

Although the invention has been described in its preferred form and structure with a certain degree of particularity, it is understood that the present disclosure of the preferred form can be changed in the details of construction and in the combination and arrangement of parts without departing from the spirit and the scope of the invention as hereinafter claimed.

As described above, a process is performed to mount a chip device on a resin substrate by performing ultrasonic bonding such that the position of a connecting electrode of the chip device is aligned to the position of a circuit electrode provided for a resin substrate having elastic modulus $\epsilon r$ at room temperature and elastic modulus $\epsilon h$ realized when the resin substrate is heated, the ultrasonic bonding method comprising: a step of heating the resin substrate to a temperature at which the ratio of the elastic modulus $\epsilon r$ at room temperature and the elastic modulus $\epsilon h$ realized after heating satisfies $1 > \epsilon h/\epsilon r \geq 0.5$ when the circuit electrode and the connecting electrode are ultrasonic-bonded to each other. Therefore, when the chip device is face-down mounted by using the resin substrate, the ultrasonic bonding conditions for the resin substrate can be optimized. Thus, ultrasonic bonding can be performed which permits a wide margin in the bonding process, with which stable joining can be performed and which exhibits satisfactory reliability for a long time.

What is claimed is:

1. An ultrasonic bonding method arranged to mount a chip device on a resin substrate by performing ultrasonic bonding such that the position of a connecting electrode of the chip device is aligned to the position of a circuit electrode provided for a resin substrate having elastic modulus $\epsilon r$ at room temperature and elastic modulus $\epsilon h$, realized when said resin substrate is heated, said ultrasonic bonding method comprising:

heating said resin substrate to a temperature at which the ratio of the elastic modulus $\epsilon r$ at room temperature and the elastic modulus $\epsilon h$ realized after heating satisfies $1 > \epsilon h/\epsilon r \geq 0.5$ when said circuit electrode and said connecting electrode are ultrasonic-bonded to each other.

2. An ultrasonic bonding method according to claim 1, wherein temperature raised when said resin substrate is ultrasonic-bonded satisfies a range from 80° C. to 170° C.

3. An ultrasonic bonding method according to claim 1, wherein an amount of amplitude of ultrasonic waves arranged to be imparted on said chip device when said ultrasonic bonding operation is performed satisfies a range from 0.8 $\mu$m to 1.6 $\mu$m.

4. An ultrasonic bonding method according to claim 1, wherein said chip device is a surface acoustic wave device having a dielectric substrate, and said connecting electrode is a bump electrode formed on said dielectric substrate and made of gold or a gold alloy.

5. An ultrasonic bonding method according to claim 1, wherein said resin substrate is a thermosetting resin substrate, and said circuit electrode is constituted by forming a plated layer on the surface of a copper foil pattern, and the uppermost layer of said plated layer is made of gold.

* * * * *